US008964453B2

(12) United States Patent
Lin et al.

(10) Patent No.: US 8,964,453 B2
(45) Date of Patent: Feb. 24, 2015

(54) SRAM LAYOUTS

(71) Applicant: Synopsys, Inc., Mountain View, CA (US)

(72) Inventors: Xi-Wei Lin, Fremont, CA (US); Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/929,076

(22) Filed: Jun. 27, 2013

(65) Prior Publication Data

US 2014/0003133 A1    Jan. 2, 2014

Related U.S. Application Data

(60) Provisional application No. 61/690,563, filed on Jun. 28, 2012.

(51) Int. Cl.

| | |
|---|---|
| *G11C 11/00* | (2006.01) |
| *G11C 11/419* | (2006.01) |
| *G06F 17/50* | (2006.01) |
| *H01L 21/8238* | (2006.01) |
| *H01L 27/02* | (2006.01) |
| *G11C 11/412* | (2006.01) |
| *H01L 27/11* | (2006.01) |

(52) U.S. Cl.
CPC .......... *G11C 11/419* (2013.01); *G06F 17/5072* (2013.01); *H01L 21/823828* (2013.01); *H01L 27/0207* (2013.01); *G11C 11/412* (2013.01); *G06F 17/5068* (2013.01); *H01L 27/1104* (2013.01)
USPC ............ 365/154; 365/49.11; 365/51; 365/63; 365/69; 365/174; 365/188

(58) Field of Classification Search
USPC ............ 365/49.11, 51, 63, 69, 154, 174, 188
See application file for complete search history.

(56) References Cited

U.S. PATENT DOCUMENTS

| | | | |
|---|---|---|---|
| 6,867,460 B1 | 3/2005 | Anderson et al. | |
| 7,190,050 B2 | 3/2007 | King et al. | |
| 7,923,757 B2 | 4/2011 | Becker et al. | |
| 8,264,044 B2 | 9/2012 | Becker | |
| 8,283,231 B2 * | 10/2012 | Merelle et al. | ................ 438/276 |
| 8,286,118 B2 | 10/2012 | McElvain | |

(Continued)

OTHER PUBLICATIONS

PCT/US2013/048692—International Search Report and Written Opinion dated Oct. 21, 2013, 12 pages.

Mann et al., "New Category of Ultra-Thin Notchless 6T SRAM Cell Layout Topologies for Sub-22nm," IEEE, 11th Int'l Symposium on Quality Electronic Design, Jul. 2010, 6 pages.

(Continued)

*Primary Examiner* — Fernando Hidalgo
(74) *Attorney, Agent, or Firm* — Haynes Beffel & Wolfeld LLP; Warren S. Wolfeld

(57) ABSTRACT

Roughly described, the cell layout in an SRAM array is re-arranged such that the gate electrodes for transistors for which flexibility to use one channel length is desired, are formed along a different track from those for transistors for which flexibility to use a different channel length is desired. Not only does such a re-arrangement permit optimization of device ratios, but also in certain implementations can also reduce, rather than increase, cell area. Specific example layouts are described. The invention also involves layout files, macrocells, lithographic masks and integrated circuit devices incorporating these principles, as well as fabrication methods.

36 Claims, 11 Drawing Sheets

(56) References Cited

U.S. PATENT DOCUMENTS

| | | |
|---|---|---|
| 2008/0037311 A1 | 2/2008 | Tanaka |
| 2009/0159975 A1 | 6/2009 | Chang |
| 2009/0168498 A1 | 7/2009 | Pillarisetty et al. |
| 2010/0237419 A1 | 9/2010 | Yang et al. |
| 2010/0258879 A1 | 10/2010 | Becker |

OTHER PUBLICATIONS

Carlson et al., "FinFET SRAM with Enhanced Read /Write Margins," 2006 IEEE International 501 Conference Proceedings, Jul. 2006, pp. 105-106.

Lu et al., "Compact Modeling of Variation in FinFET SRAM Cells," IEEE Design & Test of Computers, pp. 2006, pp. 44-50.

Guo et al., "FinFET-Based SRAM Design," ISLPED'05, Aug. 8-10, 2005, San Diego, California, pp. 2-7.

Chin et al., "Design Trade-offs of a 6T FinFET SRAM Cell in the Presence of Variations," IEEE. Symp. VLSI Circuits, 2006, 5 pages.

Lu et al., "Design of FinFET SRAM Cells Using a Statistical Compact Model," International Conference on Simulation of Semiconductor Processes and Devices, 2009. SISPAD '09, 5 pages.

Carlson et al., "SRAM Read/Write Margin Enhancements Using FinFETs," IEEE Transactions on Very Large Scale Integration (VLSI) Systems, vol. 18, No. 6, Jun. 2010, pp. 887-900.

* cited by examiner

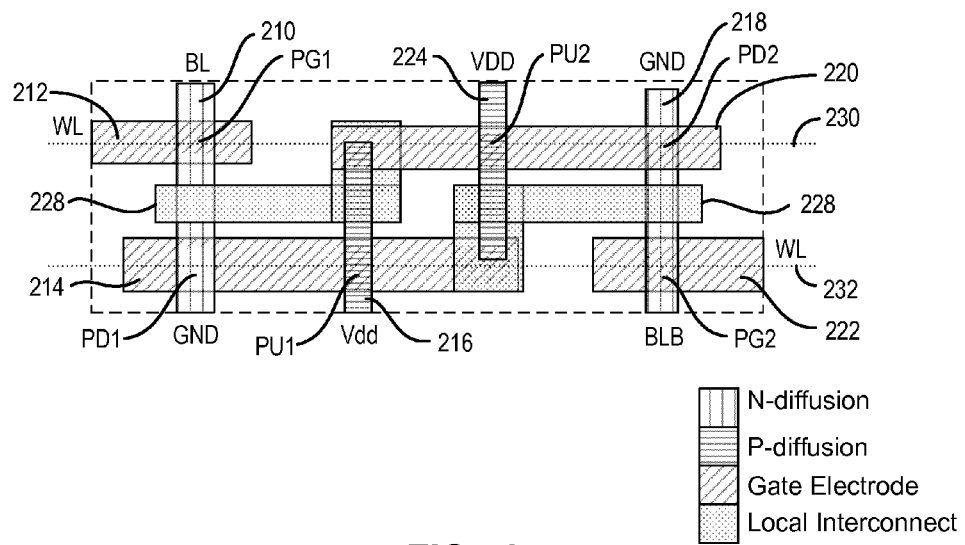
FIG. 2
(PRIOR ART)
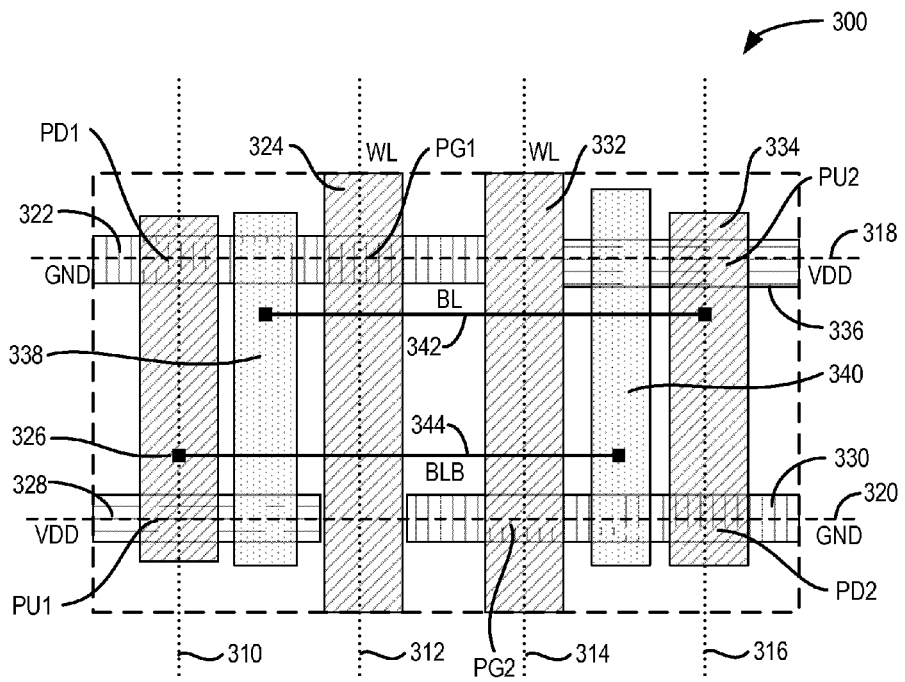
FIG. 3   PG in the middle

US 8,964,453 B2

SRAM LAYOUTS

CROSS-REFERENCE TO OTHER APPLICATIONS

This application is a non-provisional of U.S. Provisional Application No. 61/690,563, filed 28 Jun. 2012, which is incorporated herein by reference in its entirety.

BACKGROUND

1. Field of the Invention

The invention relates to static random access memory (SRAM), and more particularly to SRAM array and cell layouts, layout methods for such memories, and related technologies.

2. Description of Related Art

In most integrated circuit designs, SRAM is a critical component that occupies relatively large area, draws significant power, and determines chip performance. Despite feature size scaling, the minimum channel length in an SRAM cell remains nearly twice as large as that in core logic areas, due to the need to control variability and leakage.

A typical 6-transistor SRAM cell 100 circuit schematic is shown in FIG. 1. It is based on a pair of cross-connected inverters, and includes a first inverter made with a first P-channel pull-up transistor PU1 and a first N-channel pull-down transistor PD1, and a second inverter made with a second P-channel pull-up transistor PU2 and a second N-channel pull-down transistor PD2. The drain of transistor PU1 is connected to the drain of transistor PD1, and the drain of transistor PU2 is connected to the drain of transistor PD2. The sources of both transistors PU1 and PU2 are connected to Vdd and the sources of both transistors PD1 and PD2 are connected to ground. The gates of transistors PU1 and PD1 are connected together and to the node connecting the drain of PU2 with the drain of PD2. Similarly, the gates of transistors PU2 and PD2 are connected together and to the node connecting the drain of PU1 with the drain of PD1. The 'true' bit line BL is connected to the gates of transistors PU2 and PD2 through a first pass gate transistor PG1, and the 'complement' bit line BLB is connected to the gates of transistors PU1 and PD1 through a second pass gate transistor PG2. As used herein, the terms "true" and "complement" bit lines are used as a convenience to mean opposite polarity bit lines of a differential pair. In a particular array, which bit line is considered "true" and which is considered "complement" depends on circuitry outside the array.

A typical FinFET-based layout of the 6-transistor cell 100 is shown in FIG. 2. The layout diagram shows an N-channel diffusion 210, in which channel regions of transistors PG1 and PD1 are defined by gate electrodes 212 and 214, respectively. Also shown is a P-channel diffusion 216, in which gate electrode 214 defines the channel region of transistor PU1. Also shown is another N-channel diffusion 218, in which channel regions of transistors PD2 and PG2 are defined by gate electrodes 220 and 222, respectively. Also shown is another P-channel diffusion 224, in which gate electrode 220 defines the channel region of transistor PU2. The diffusions 210, 216, 218 and 224 are formed in fins. Local metal interconnect 226 connects the gate electrode 220 to the junction between transistors PG1, PD1 and PU1, and Local interconnect 228 connects the gate electrode 214 to the junction between transistors PG2, PD2 and PU2. Higher level metal interconnects are not shown in FIG. 2, but connections to WL, BL, BLB, Vdd and GND are indicated. In general, unless otherwise stated, for clarity of illustration, such higher level interconnects are not shown in any of the layout drawings herein.

If $\lambda$ is the minimum pitch for a particular fabrication technology, the width of the gate conductors 212, 214, 220 and 222 (and therefore the channel lengths of all the transistors) may for example be $0.8\lambda$ (twice the minimum channel length of $0.4\lambda$). The fin width may be $0.36\lambda$, yielding a total cell area of $36\lambda^2$.

For a variety of reasons, integrated circuit features at advanced technology nodes are typically laid out along orthogonal parallel virtual lines. For the gate electrodes, a number of parallel virtual lines are defined to extend across the layout, or at least across the SRAM cell array. These parallel virtual lines are referred to herein as gate electrode tracks or layout tracks, and they are used to index placement of gate electrodes of the transistors within the layout. In the layout of FIG. 2, the six transistors share two gate electrode tracks: electrodes 212 and 220 share a track 230, and electrodes 214 and 222 share a track 232. As feature sizes continue to shrink, it has become very difficult to vary the width of the electrode material sharing a particular track. The difficulty arises in part because of diffraction artifacts caused by sub-wavelength lithography. Thus all the transistors sharing a particular track typically have the same channel length. In the layout of FIG. 2, this means that transistors PG1, PU2 and PD2 all have the same channel length, and transistors PG2, PU1 and PD1 all have the same channel length. In addition, transistor channel widths can be varied only by adding or subtracting fins, a quantized adjustment which precludes continuous transistor width sizing.

In an SRAM cell based on cross-connected inverters, a balance is required between the read and write operations. The feedback within the cell must be weak enough such that a data write operation can flip the stored value, but its output drive current also must be strong enough to charge up the bit lines when selected during a read operation. In older technologies, it was commonplace to adjust the channel lengths and widths of the various transistors in order to achieve device ratios which achieve this balance with optimal static noise margin, leakage, and area. Unfortunately, the SRAM layout of FIG. 2 does not permit such individual transistor sizing.

Aspects of the invention address this problem.

SUMMARY

An opportunity therefore arises to create robust solutions to the problem of SRAM cell optimization at advanced technology nodes, primarily but not exclusively in FinFET environments.

Roughly described, the invention involves re-arranging the cell layout in an SRAM array such that the gate electrodes for different transistors for which flexibility to use different channel lengths is desired, are formed along different layout tracks. It has been discovered that not only does such a re-arrangement permit optimization of device ratios, but also in certain implementations can also reduce, rather than increase, cell area. Specific example layouts are described. The invention can be reflected in and present in layout files, macrocells, lithographic masks and integrated circuit devices incorporating these principles, as well as fabrication methods.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which:

FIG. 2 is a plan view of a typical FinFET-based layout of the cell of FIG. 1.

FIGS. 3-9 are plan views of example layouts incorporating aspects of the invention, of the 6-transistor SRAM circuit of FIG. 1.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
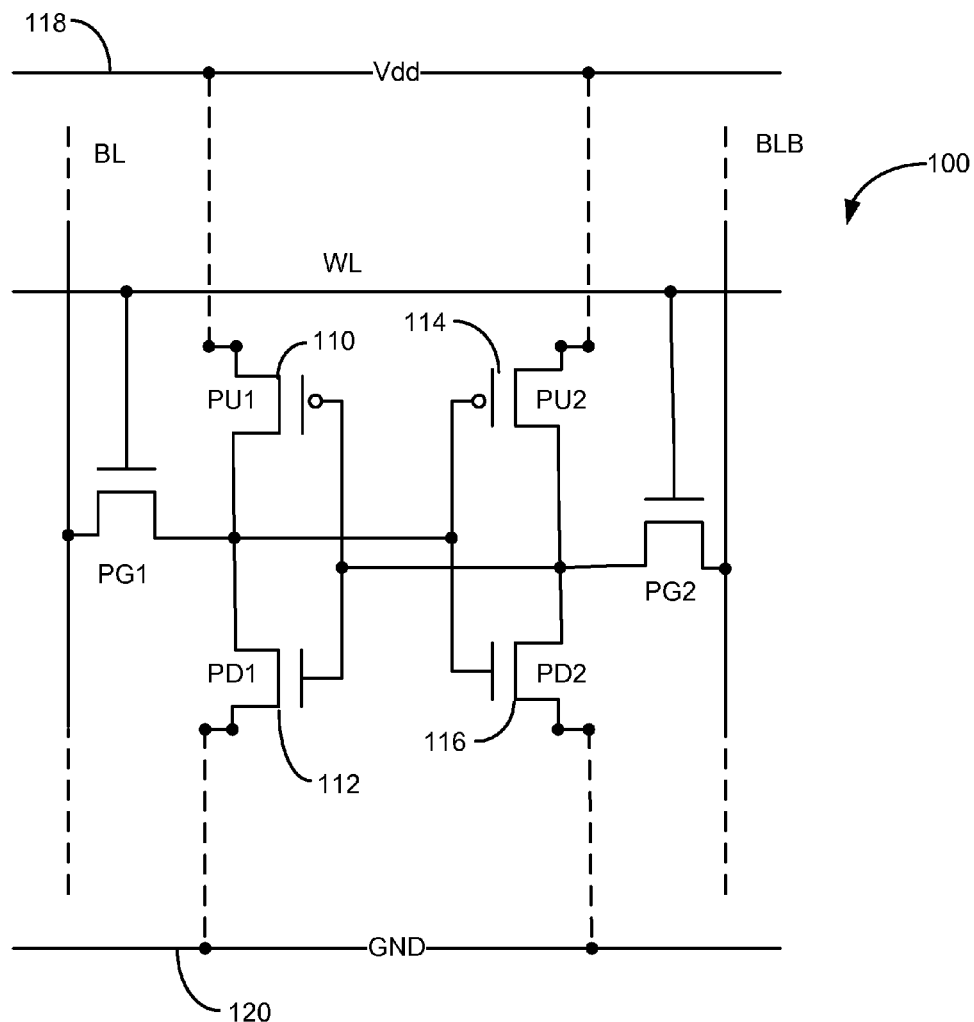
FIG. 1 is a circuit schematic of a typical 6-transistor SRAM cell.

FIG. 3 is a plan view of an example layout 300 incorporating aspects of the invention, of the 6-transistor SRAM circuit of FIG. 1. It includes four gate electrode tracks 310, 312, 314 and 316 rather than two as in FIG. 2, and two diffusion tracks 318, 320 rather than four as in FIG. 2. In particular, the layout includes an N-channel diffusion 322, in which channel regions of transistors PG1 and PD1 are defined by gate electrodes 324 and 326, respectively. Also shown is a P-channel diffusion 328, in which gate electrode 326 also defines the channel region of transistor PU1. Also shown is another N-channel diffusion 330, in which channel regions of transistors PG2 and PD2 are defined by gate electrodes 332 and 334, respectively. Also shown is another P-channel diffusion 336, in which gate electrode 334 also defines the channel region of transistor PU2. Each of the gate electrodes can be a single material in one embodiment, or a composite or layered material in other embodiments. The diffusions 322 and 336 are formed in fins sharing diffusion track 318, and diffusions 328 and 330 are formed in fins sharing diffusions track 320. Different fins sharing a layout track are separated from each other longitudinally by a dielectric. Local metal interconnect 338 connects together the common junction between transistors PG1, PD1 and PU1, and a higher level metal interconnect 342 (shown symbolically) connects this junction further to gate electrode 334. Similarly, local interconnect 340 connects together the common junction between transistors PG2, PD2 and PU2, and a higher level metal interconnect 344 (shown symbolically) connect this junction further to gate electrode 326. As with FIG. 2, other higher level metal interconnects are not shown in FIG. 3, but connections to WL, BL, BLB, Vdd and GND are indicated.

As used herein, a "fin" is a segment of semiconductor ridge material which is physically spaced by dielectric (including air) from all other segments of semiconductor ridge material.

It can be seen that the word line (WL) gate electrodes 324 and 332 in this example, which define the channels of transistors PG1 and PG2, do not share tracks with the gate electrodes 326 and 334, which define the channels of transistors PU1, PD1, PU2 and PD2. Thus the layout designer can select a gate electrode width for PG1 and PG2 which differs from those for PU1, PD1, PU2 and PD2. Because the length of the channel of a transistor as defined by a gate electrode is defined by the width of the gate electrode, it can be seen that a gate electrode of narrower or wider width will define a transistor channel having shorter or longer length. Therefore, with the arrangement in FIG. 3, the layout designer can select a channel length for PG1 and PG2 which differs from those for PU1, PD1, PU2 and PD2.

Additionally, the gate electrode 324 for PG1 also does not share a track with the gate electrode 332 for PG2. Thus if desired, the layout designer can select different channel lengths for these two transistors as well. Still further, the gate electrode 326 for transistors PD1 and PU1 does not share a track with the gate electrode 334 for transistors PU2 and PD2, so if desired, the layout designer also can select different channel lengths for PD1 and PU1 relative to PD2 and PU2. In other words, the layout of FIG. 3 offers the layout designer significantly more flexibility to adjust the channel lengths of the various transistors in order to achieve device ratios which achieve a balance with optimal static noise margin and leakage. Moreover, if the fin and electrode widths remain the same as those in FIG. 2, there is no change in the chip area occupied by the cell ($36\lambda^2$).

Figure 4:
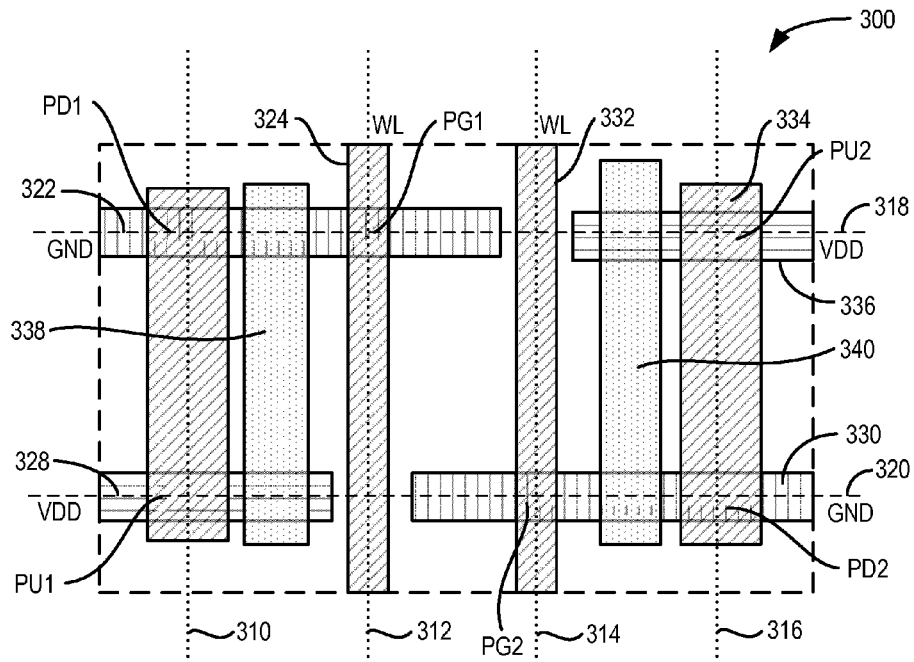

FIG. 4 is a plan view of the example layout of FIG. 3, in which an aspect of the flexibility of design introduced in FIG. 3 is demonstrated. In particular, in the layout of FIG. 4, the word line gate electrodes 324 and 332 are narrower than electrodes 326 and 334, providing a shorter channel length for transistors PG1 and PG2 than for transistors PU1, PD1, PU2 and PD2. The layout of FIG. 4 also can be made to occupy less area than that of FIG. 3. For example, if the word line 324 and 332 widths are each reduced by half (to $0.4\lambda$ each), then the cell width reduces by $0.8\lambda$ and the cell area reduces to $32\lambda^2$, an 11% savings.

In other embodiments the word line widths can be increased rather than decreased relative to the gate electrodes for the pull-up and pull-down transistors, or the word line widths can be left unchanged while those for the pull-up and pull-down transistors are increased or decreased. In still other embodiments, any one, two or three of the electrodes 326, 324, 332 and 334 can be increased or decreased as needed to optimize transistor ratios for noise margin (or for any other purpose).

Figure 5:
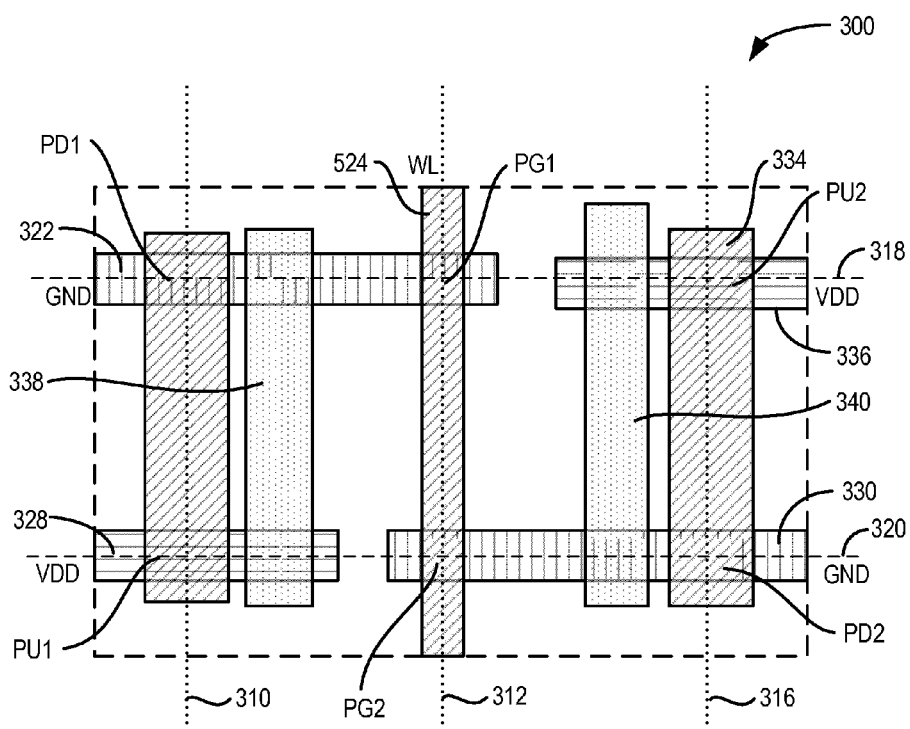

As mentioned, in the layout of FIG. 4, gate electrodes 324 and 332 occupy separate tracks. The channel lengths of transistors PG1 and PG2 therefore can be adjusted independently of each other. If this is not necessary, then in another embodiment gate electrodes 324 and 332 can be combined into a single electrode occupying a single track. Such an embodiment is illustrated in the plan view schematic layout of FIG. 5. As compared to FIG. 4, it can be seen that gate electrodes 324 and 332 in FIG. 4 have been replaced in FIG. 5 by a single gate electrode 524 defining the channel regions of both transistors PG1 and PG2. Thus it is much more difficult to adjust the channel lengths of transistors PG1 and PG2 independently from each other as in FIG. 4 at advanced technology nodes. Note that the combining of the two word lines into one gate electrode 524 might or might not itself permit reduced cell area, depending on other design rules such as the minimum end-to-end longitudinal fin spacing.

Figure 6:
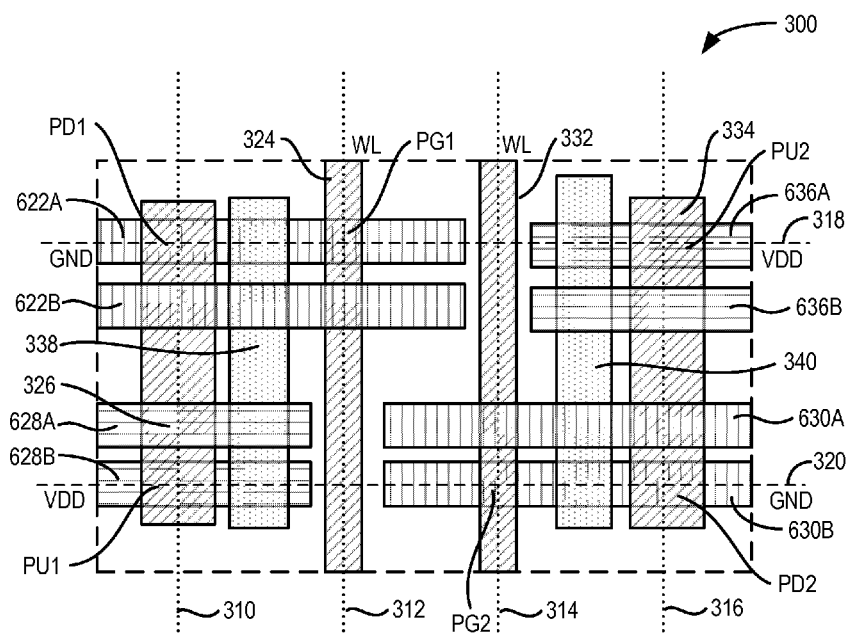
Figure 7:
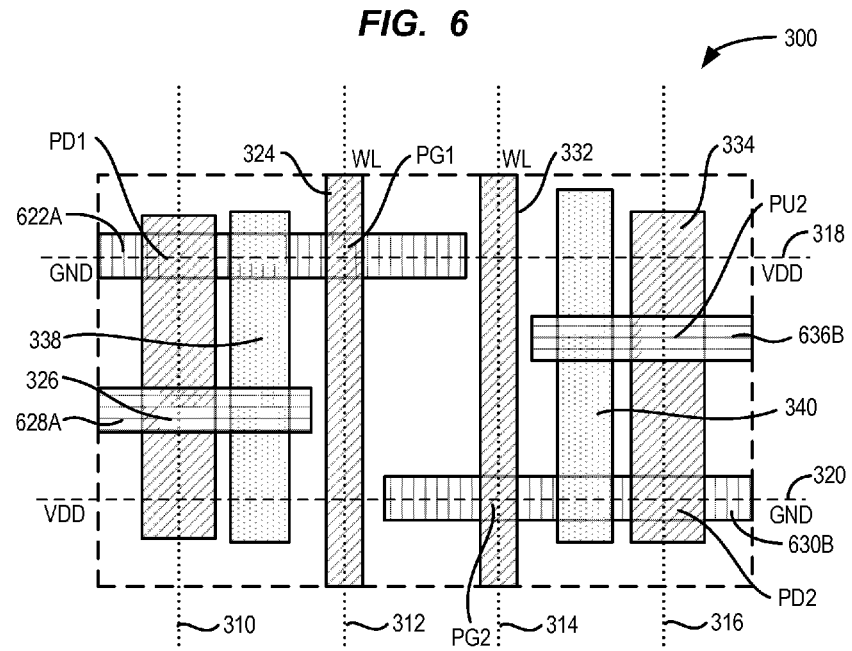

FIG. 6 is a plan view schematic of another example layout. It is similar to the layout of FIG. 4, except that each of the fins has been doubled. In particular, N-channel fin 322 has been replaced by a parallel pair of fins 622A and 622B; P-channel fin 328 has been replaced by a parallel pair of fins 628A and 628B; N-channel fin 336 has been replaced by a parallel pair of fins 636A and 636B; and P-channel fin 330 has been replaced by a parallel pair of fins 630A and 630B. Since the gate electrodes remain unchanged, with appropriate interconnects all the transistors in the cell of FIG. 6 have double the effective channel width as compared to those in FIG. 4. In other embodiments, only one, two or three of the fins can be doubled instead of all four, and in still other embodiments still other quantities of fins can be provided in the various transistors. FIG. 7 is a plan view of yet another example layout illustrating that fins do not necessarily have to share tracks.

Figures 8, 9:
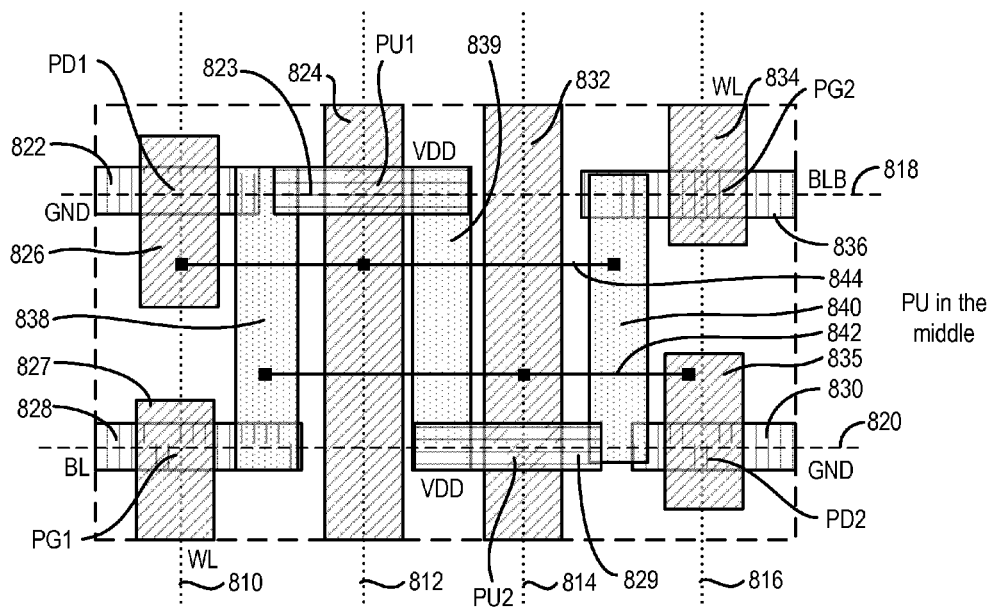

As mentioned, in the embodiments of FIGS. 3 and 4, the channel lengths of pass gate transistors PG1 and PG2 can be adjusted independently of the channel lengths of the pull-up and pull-down transistors PU1, PD1, PU2 and PD2. FIG. 8 is a plan view of another example layout in which the channel lengths of the pull-up transistors PU1 and PU2 can be adjusted independently of the channel lengths of pass gate and pull-down transistors PG1, PG2, PD1 and PD2.

As in the embodiments of FIGS. 3 and 4, the layout of FIG. 8 includes four gate electrode tracks 810, 812, 814 and 816 rather than two as in FIG. 2, and two diffusion tracks 818, 820 rather than four as in FIG. 2. The layout of FIG. 8 includes an N-channel diffusion 822, in which the channel region of transistor PD1 is defined by gate electrode 826. Also shown is P-channel diffusion 823, in which the channel region of transistor PU1 is defined by gate electrode 824. Also shown is an N-channel diffusion 836, in which gate electrode 834 defines the channel region of transistor PG2. Also shown is another N-channel diffusion 828, in which channel region of transistor PG1 is defined by gate electrode 827. Also shown is another P-channel diffusion 829, in which gate electrode 832 defines the channel region of transistor PU2. Also shown is another N-channel diffusion 830, in which gate electrode 835 defines the channel region of transistor PD2. The diffusions 822, 823 and 836 are formed in fins sharing diffusion layer track 818, and diffusions 828, 829 and 830 are formed in fins sharing diffusion layer track 820. Local metal interconnect 838 connects together the common junction between transistors PG1, PD1 and PU1, and a higher level metal interconnect 842 (shown symbolically) connects this junction further to gate electrodes 832 and 835. Similarly, local interconnect 840 connects together the common junction between transistors PG2, PD2 and PU2, and higher level metal interconnect 844 (shown symbolically) connects this junction further to gate electrodes 824 and 826. Another local interconnect 839 connects together the sources of transistors PU1 and PU2 for ultimate connection to Vdd. As with all layout drawings herein, unless otherwise stated, other higher level metal interconnects are not shown in FIG. 8. However, connections to WL, BL, BLB, Vdd and GND are indicated.

It can be seen that the gate electrodes 824 and 832 in this example, which define the channels of transistors PU1 and PU2, do not share tracks with the gate electrodes 826, 827, 834 and 835, which define the channels of transistors PG1, PD1, PG2 and PD2. Thus the layout designer can select a gate electrode width (and therefore channel length) for PU1 and PU2 which differs from those for PG1, PD1, PG2 and PD2. Additionally, the gate electrode 824 for PU1 also does not share a track with the gate electrode 832 for PU2. Thus if desired, the layout designer can select different channel lengths for these two transistors as well. Still further, the gate electrodes 826 and 827 for transistors PD1 and PG1 (which do share track 810), do not share a track with the gate electrodes 834 and 835 for transistors PG2 and PD2 (which do share track 816). So if desired, the layout designer also can select different channel lengths for PD1 and PG1 relative to PD2 and PG2. In other words, like the layout of FIG. 3, the layout of FIG. 8 offers the layout designer significantly more flexibility to adjust the channel lengths of the various transistors in order to achieve device ratios which achieve a balance with optimal static noise margin and leakage.

Similarly, FIG. 9 is a plan view schematic of yet another example cell layout in which the channel lengths of the pull-down transistors PD1 and PD2 can be adjusted independently of the channel lengths of pass gate and pull-down transistors PG1, PG2, PU1 and PU2.

As in the embodiments of FIGS. 3, 4 and 8, the layout of FIG. 9 includes four gate electrode tracks 910, 912, 914 and 916 rather than two as in FIG. 2, and two diffusion tracks 918, 920 rather than four as in FIG. 2. The layout of FIG. 9 includes an N-channel diffusion 922, in which the channel region of transistors PG1 and PD1 are defined by gate electrodes 926 and 924, respectively. Also shown is a P-channel diffusion 928, in which the channel region of transistor PU1 is defined by gate electrode 927. Also shown is another P-channel diffusion 936, in which the channel region of transistor PU2 is defined by gate electrode 934. Also shown is another N-channel diffusion 930, in which gate electrodes 932 and 935 define the channel regions of transistors PD2 and PG2, respectively. The diffusions 922 and 936 are formed in fins sharing diffusion layer track 918, and diffusions 928 and 930 are formed in fins sharing diffusions layer track 920. Local metal interconnect 938 connects together the common junction between transistors PG1, PD1 and PU1, and a higher level metal interconnect 844 (shown symbolically) connects this junction further to gate electrodes 932 and 934. Similarly, local interconnect 940 connects together the common junction between transistors PG2, PD2 and PU2, and higher level metal interconnect 942 (shown symbolically) connects this junction further to gate electrodes 924 and 927. Another local interconnect 939 connects together the sources of transistors PD1 and PD2 for ultimate connection to ground. Other higher level metal interconnects, not shown in FIG. 9, connect the shapes of FIG. 9 to WL, BL, BLB, Vdd and GND as indicated in the drawing.

It can be seen that the gate electrodes 924 and 932 in this example, which define the channels of transistors PD1 and PD2, do not share tracks with the gate electrodes 926, 927, 934 and 935, which define the channels of transistors PG1, PU1, PG2 and PU2. Thus the layout designer can select a gate electrode width (and therefore channel length) for PD1 and PD2 which differs from those for PG1, PU1, PG2 and PU2. Additionally, the gate electrode 924 for PD1 also does not share a track with the gate electrode 932 for PD2. Thus if desired, the layout designer can select different channel lengths for these two transistors as well. Still further, the gate electrodes 926 and 927 for transistors PG1 and PU1 (which do share track 910), do not share a track with the gate electrodes 934 and 935 for transistors PG2 and PU2 (which do share track 916). So if desired, the layout designer also can select different channel lengths for PU1 and PG1 relative to PU2 and PG2. In other words, like the layout of FIG. 3, the layout of FIG. 9 offers the layout designer significantly more flexibility to adjust the channel lengths of the various transistors in order to achieve device ratios which achieve a balance with optimal static noise margin and leakage. Note that all of the variations set forth above with respect to the example layout of FIG. 3 can also be applied to the example layout of FIGS. 8 and 9.

Thus FIGS. 3, 5, 8 and 9 illustrate a variety cell topologies for the 6-transistor SRAM cell of FIG. 1, in which increased flexibility for noise margin, leakage and cell area is made available to the layout designer by separating gate electrodes so as to occupy different layout tracks. Still other layouts will be apparent to the reader. In general, it can be seen that the six transistors that make up the memory cell can be grouped into purposes: two are pass gate transistors, two are pull-up transistors, and two are pull-down transistors. For convenience, the groupings are sometimes referred to herein by their functions. That is, the two pass gate transistors are sometimes referred to herein as having a first function, the two pull-up transistors are sometimes referred to herein as having a second function, and the two pull-down transistors are sometimes referred to herein as having a third function, all three functions being different. The layout topologies share a common feature that the gate electrode of at least a first one of the transistors of one of the functions does not share a layout track with the gate electrodes of any of the transistors of either of the other two functions, and this allows the channel length of that first transistor to be adjusted independently of that of the transistors performing the other two functions. The first transistor may or may not share a layout track with the other transistor of the first function. In addition, the gate electrodes of transistors performing the other two functions can also be separated onto different tracks or combined onto common tracks in a variety of combinations, offering still further flexibility in the independent adjustment of transistor channel lengths.

Still more generally, it can be seen that with the gate electrodes of the six transistors occupying four tracks, up to four different channel lengths can be defined. The channel lengths of two of the transistors are tied to the channel lengths of other transistors in the cell. Yet further examples of the principle can be developed by separating the gate electrodes into five or even six tracks, allowing even more flexibility. These options may increase cell area, but in certain environments that may be acceptable as a tradeoff for better optimization of device ratios.

Array

Figure 10:
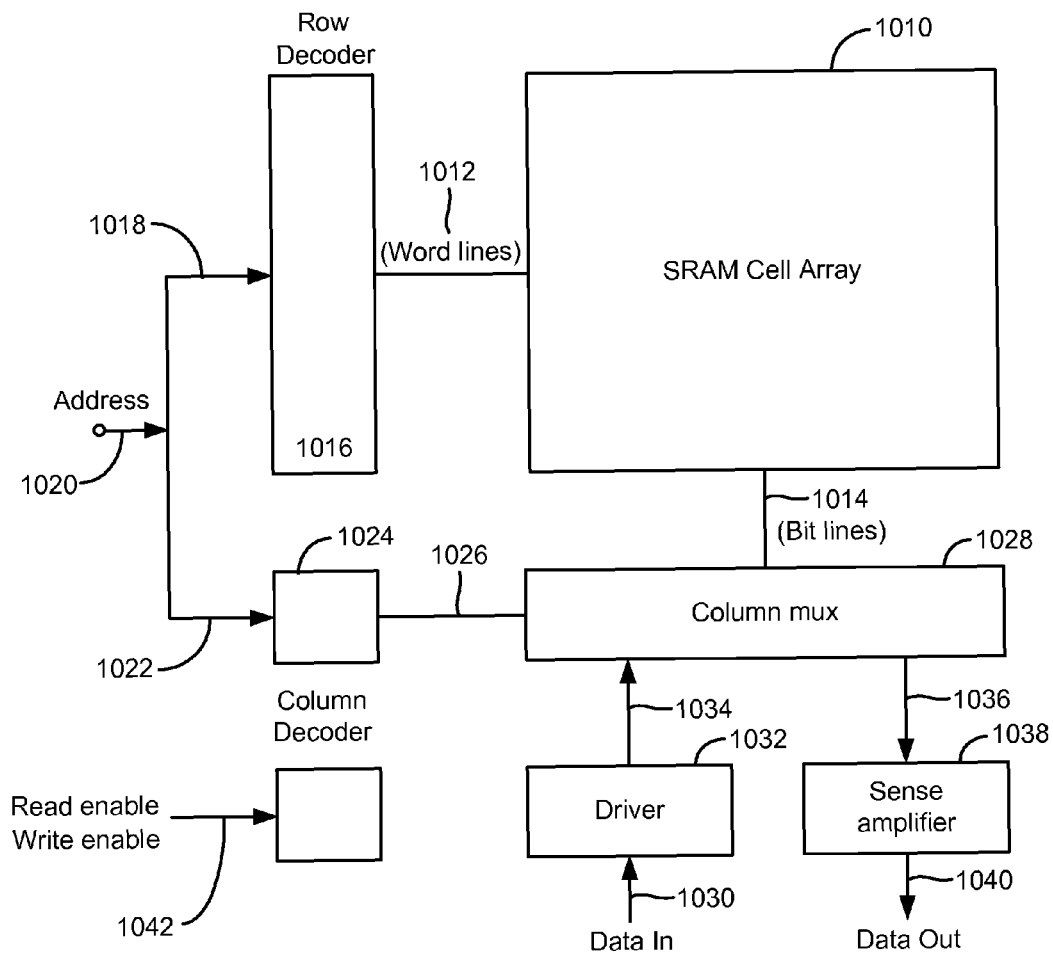
FIG. 10 is a block diagram of a typical SRAM device, which may be a standalone SRAM device or part of a larger integrated circuit device and which may incorporate aspects of the invention.

FIG. 10 is a block diagram of a typical SRAM device, which may be a standalone SRAM device or part of a larger integrated circuit device. It comprises an SRAM cell array 1010, having word lines 1012 (WL in FIG. 1) and bit lines 1014 (BL and BLB in FIG. 1). The word lines 1012 are connected to outputs of a row decoder 1016, which receives a subset 1018 of bits of the address input 1020. The remainder 1022 of the bits of the address input 1020 are connected to a column decoder 1024, which provides select lines to a column multiplexer 1028. The demultiplexed lines of the column multiplexer 1028 are the bit lines 1014. For write operations, data is provided on lines 1030 to a set of drivers 1032, which provide outputs 1034 for the column multiplexer 1028 to drive the bit lines 1014. For read operations, data from the SRAM cell array 1010 on bit lines 1014 passes through the column multiplexer 1028 in the opposite direction, and via lines 1036 to a sense amplifier 1038. The sense amplifier provides output data on Data Out lines 1040. In addition, read and write enable signals 1042 are provided to the device to enable reading or writing globally therein. The structure and operation of column multiplexer 1029, row and column decoders 1016 and 1024, driver 1032 and sense amplifier 1038 are not significant to the invention, so a reader will know a variety of designs that can be used for these functions. They are not further described herein.

Figure 11:
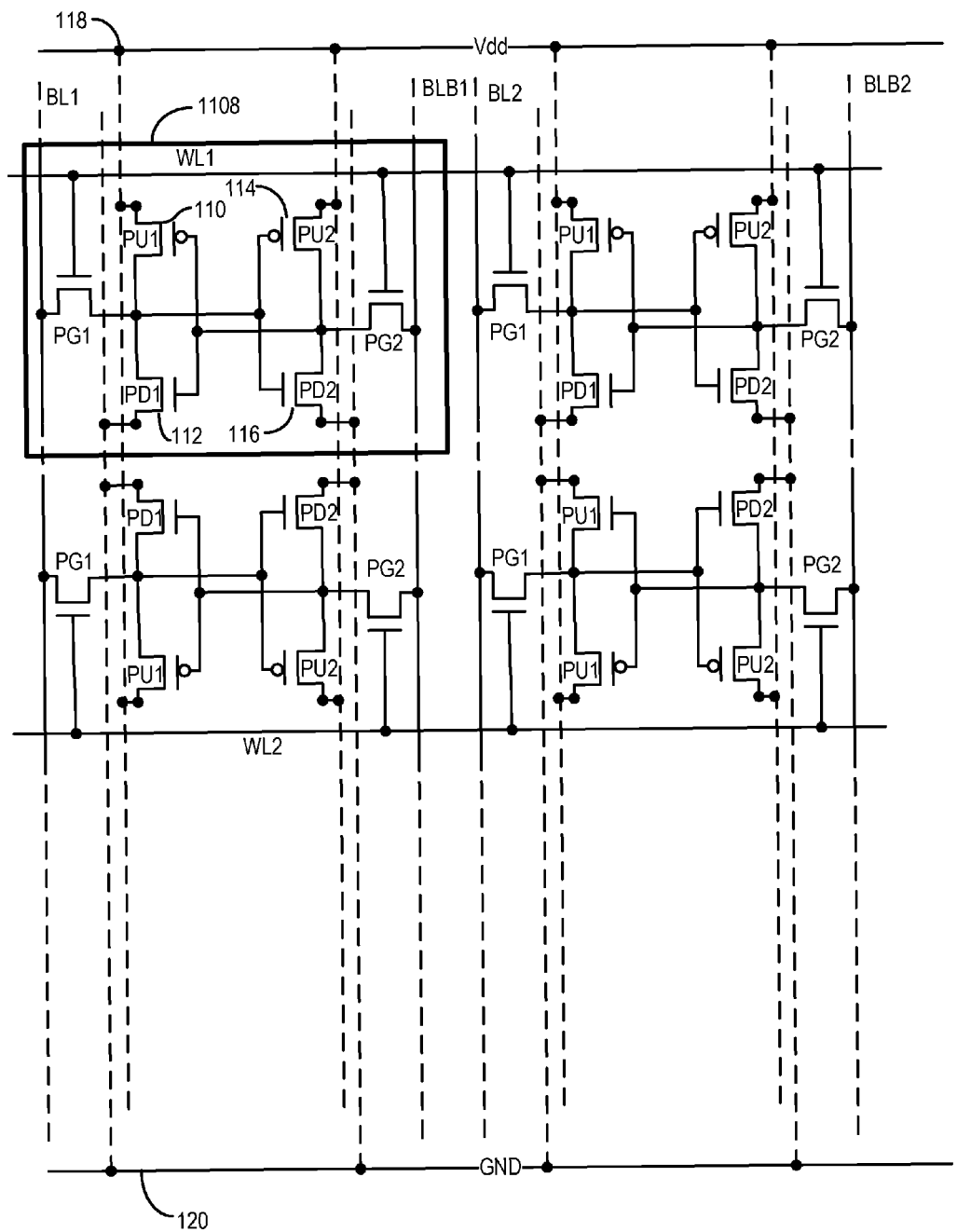
FIG. 11 is a circuit schematic of a portion of the array of FIG. 10, showing four of the cells of FIG. 1.

FIG. 11 is a circuit schematic of a portion of the array 1010, showing four of the cells of FIG. 1. A heavy black line 1108 has been added to identify the bounds of one of the cells. It can be seen that all the cells in each row share a wordline WL, and all the cells in each column share a differential pair of bit lines BL/BLB. The reader will recognize that many other arrangements are possible and known for arranging SRAM cells into arrays. Additionally, an SRAM array typically will include a much larger number of cells than the four shown in FIG. 11 (or the nine shown in FIG. 12).

Figure 12:
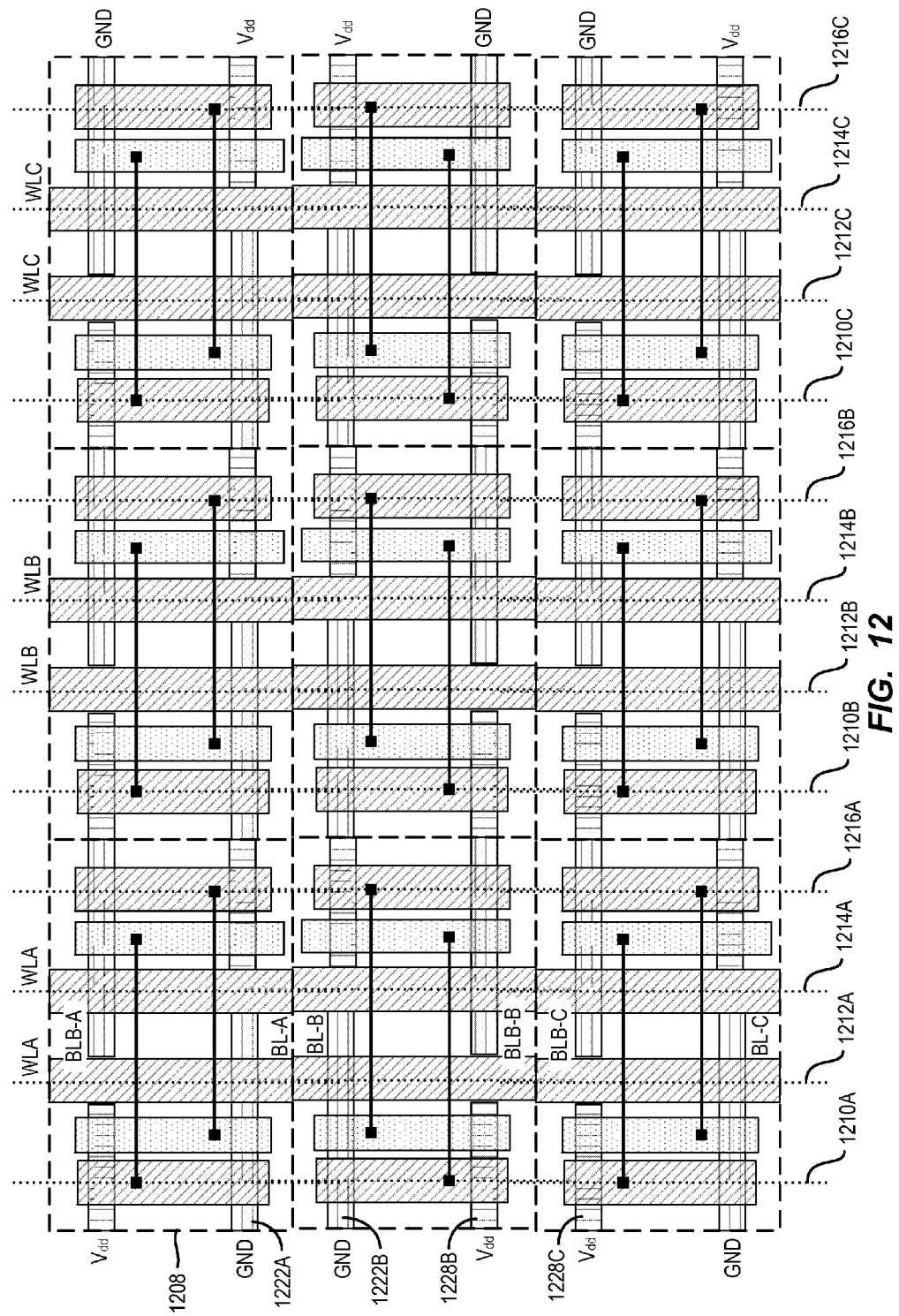
FIG. 12 is a plan view of an example layout of the array of FIG. 10, showing nine cells like that of FIG. 3.

FIG. 12 is a plan view schematic of an example layout of the array 1010, incorporating aspects of the invention. It includes nine cells like that of FIG. 3, with each cell bordered by a dashed line such as 1208. The array forms a grid illustrated and described with respect to FIG. 12 as having horizontal rows and vertical columns. Horizontally, all cells are laid out the same. Vertically, adjacent cells alternate orientation, with the cells in the top and bottom row flipped top-to-bottom relative to the cells in the center row, which match the orientation of the cell in FIG. 3. This arrangement facilitates formation of N- and P-wells. For example, the upper N-type fin 1222B in the center row of cells can share a P-well with the lower N-type fin 1222A in the upper row of cells, and the lower P-type fin 1228B in the center row of cells can share an N-well with the upper P-type fin 1228C in the lower row of cells in the drawing. It will be appreciated that the terms "horizontal" and "vertical" are used only as a convenience to mean first and second orthogonal directions generally parallel to the integrated circuit surface. Similarly, the designation of one direction as having "rows" and the other "columns" is arbitrary as well. Additionally, as used herein, the term "integrated circuit device" is unspecific as to the stage of device fabrication. For example, the wafer prior to application of any diffusions or circuitry is sometimes referred to herein as the device, as is the partially finished product at any stage of fabrication, and as is the finished product.

As in FIG. 3, the array of FIG. 12 includes four gate electrode tracks 1210, 1212, 1214 and 1216 passing through each column of cells, and two diffusion tracks passing through each row of cells. (In the drawing, the suffix A is added to the designator for the tracks passing through the cells of the left-hand column, the suffix B is added to the designator for the tracks passing through the cells of the center column, and the suffix C is added to the designator for the tracks passing through the cells of the right-hand column. When the designator is used herein without the suffix, it refers to the corresponding track in any or all of the cell columns.) The channel regions of all the PD1 and PU1 transistors are defined by gate electrodes formed along track 1210, and the channel regions of all the PU2 and PD2 transistors are defined by gate electrodes formed along track 1216. The channel regions of all the PG1 transistors are defined by gate electrodes formed along track 1212, and the channel regions of all the PG2 transistors are defined by gate electrodes formed along track 1214. Connections to word lines WLA, WLB and WLC (for the cells in the left-, center and right-hand columns, respectively) are indicated. Connections to the true bit lines BL-A, BL-B and BL-C (for the cells in the upper, center and lower rows, respectively) are indicated, as are connections to the complement bit lines BLB-A, BLB-B and BLB-C (for the cells in the upper, center and lower rows, respectively). For clarity of illustration, not all the connections in the array are indicated. However, those that are omitted will be apparent by reference to FIG. 3. For example, some of the connections to Vdd and GND are indicated for cells in the left and right column of the array, and the remainder of the connections to Vdd and GND will be apparent by reference to FIG. 3. All other features of the cells are as described with respect to FIG. 3, and as with FIG. 3, other higher level metal interconnects are not shown in FIG. 12.

It can be seen that the word line gate electrodes in this example which define the channels of transistors PG1 and PG2 in any one cell column, do not share tracks with the gate electrodes which define the channels of transistors PU1, PD1, PU2 and PD2 in that cell column. Thus the layout designer can select a gate electrode width (and therefore channel length) for PG1 and PG2 in a particular cell column which differs from those for PU1, PD1, PU2 and PD2 in that cell column. Additionally, the gate electrode for PG1 also does not share a track with the gate electrode for PG2 in a particular column. Thus if desired, the layout designer can select different channel lengths for these two transistors as well. Still further, the gate electrode for transistors PD1 and PU1 in a particular column does not share a track with the gate electrode for transistors PU2 and PD2 in the same column, so if desired, the layout designer also can select different channel lengths for PD1 and PU1 relative to PD2 and PU2 in a particular column. Moreover, the gate electrodes for one column of cells do not share tracks with the gate electrodes for any of the other columns of cells, so if desired, the layout designer also can select different channel lengths for corresponding transistors in different columns of cells. In other words, the layout of FIG. 12 offers the layout designer significantly more flexibility to adjust the channel lengths of the various transistors in order to achieve device ratios which achieve a balance with optimal static noise margin and leakage. And again, if the fin and electrode widths remain the same as those in FIG. 2, there is no change in the chip area occupied by the array.

The array architecture of FIG. 12 is only one of many architectures that can benefit from aspects of the invention. Other architectures include folded architectures, cells in multiple planes, and so on. It will be appreciated that in certain array architectures, a single array of cells can also be thought of as more than one "sub-array" of cells, which as used herein, is itself also considered an "array" of cells. In addition, whereas FIG. 12 illustrates an array of cells like those in FIG. 3, the reader will understand how to form an array of cells like those in any of FIGS. 4-9 as well. The reader will also understand how to form an array of cells incorporating aspects of the invention but not depicted explicitly in the drawings herein.

Overall Design Process Flow

Figure 13:
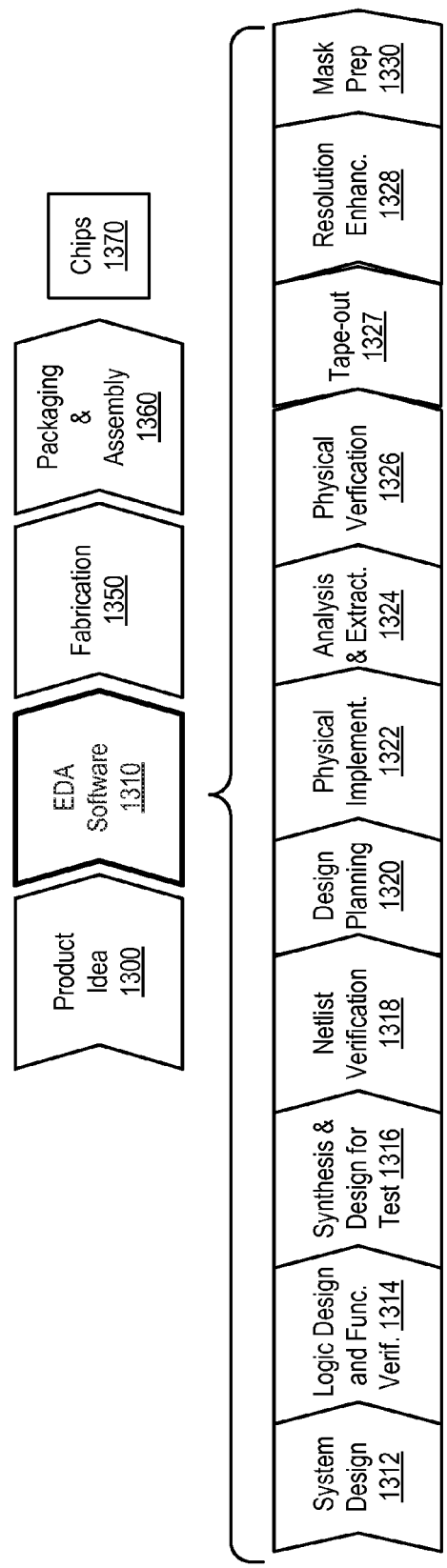
FIG. 13 shows a simplified representation of an illustrative digital integrated circuit design flow.

FIG. 13 shows a simplified representation of an illustrative digital integrated circuit design flow. At a high level, the process starts with the product idea (step 1300) and is realized in an EDA (Electronic Design Automation) software design process (step 1310). When the design is finalized, it can be taped-out (step 1327). At some point after tape out, the fabrication process (step 1350) and packaging and assembly processes (step 1360) occur resulting, ultimately, in finished integrated circuit chips (result 1370).

The EDA software design process (step 1310) is itself composed of a number of steps 1312-1330, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 1310) will now be provided.

System design (step 1312): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 1314): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 1316): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products. This step can include selection of library cells to perform specified logic functions.

Netlist verification (step 1318): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 1320): Here, an overall floor plan for the chip is constructed and analyzed for timing and top-level routing. Example EDA software products from Synopsys, Inc. that can be used at this step include Astro and Custom Designer products.

Physical implementation (step 1322): The placement (positioning of circuit elements) and routing (connection of the same) occurs at this step, as can selection of library cells to perform specified logic functions. Example EDA software products from Synopsys, Inc. that can be used at this step include the Astro, IC Compiler, and Custom Designer products.

Analysis and extraction (step 1324): At this step, the circuit function is verified at a transistor level, this in turn permits what-if refinement. Example EDA software products from Synopsys, Inc. that can be used at this step include AstroRail, PrimeRail, PrimeTime, and Star-RCXT products.

Physical verification (step 1326): At this step various checking functions are performed to ensure correctness for: manufacturing, electrical issues, lithographic issues, and circuitry. Example EDA software products from Synopsys, Inc. that can be used at this step include the Hercules product.

Tape-out (step 1327): This step provides the "tape-out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 1328): This step involves geometric manipulations of the layout to improve manufacturability of the design. Example EDA software products from Synopsys, Inc. that can be used at this step include Proteus, ProteusAF, and PSMGen products.

Mask data preparation (step 1330): This step provides mask-making-ready "tape-out" data for production of masks for lithographic use to produce finished chips. Example EDA software products from Synopsys, Inc. that can be used at this step include the CATS(R) family of products.

Fabrication Process

After the an integrated circuit device has been designed and laid out in accordance with aspects of the invention, and masks have been formed, the device itself can be fabricated using any of a variety of methods now known or developed in the future. The individual steps in the fabrication process need not be altered in order to incorporate features of the invention. Only a high level description of significant steps in the process are described herein, therefore, the details being apparent to the reader. As used herein, no distinction is made between elements "in" or "on" a wafer or substrate.

Figure 15:
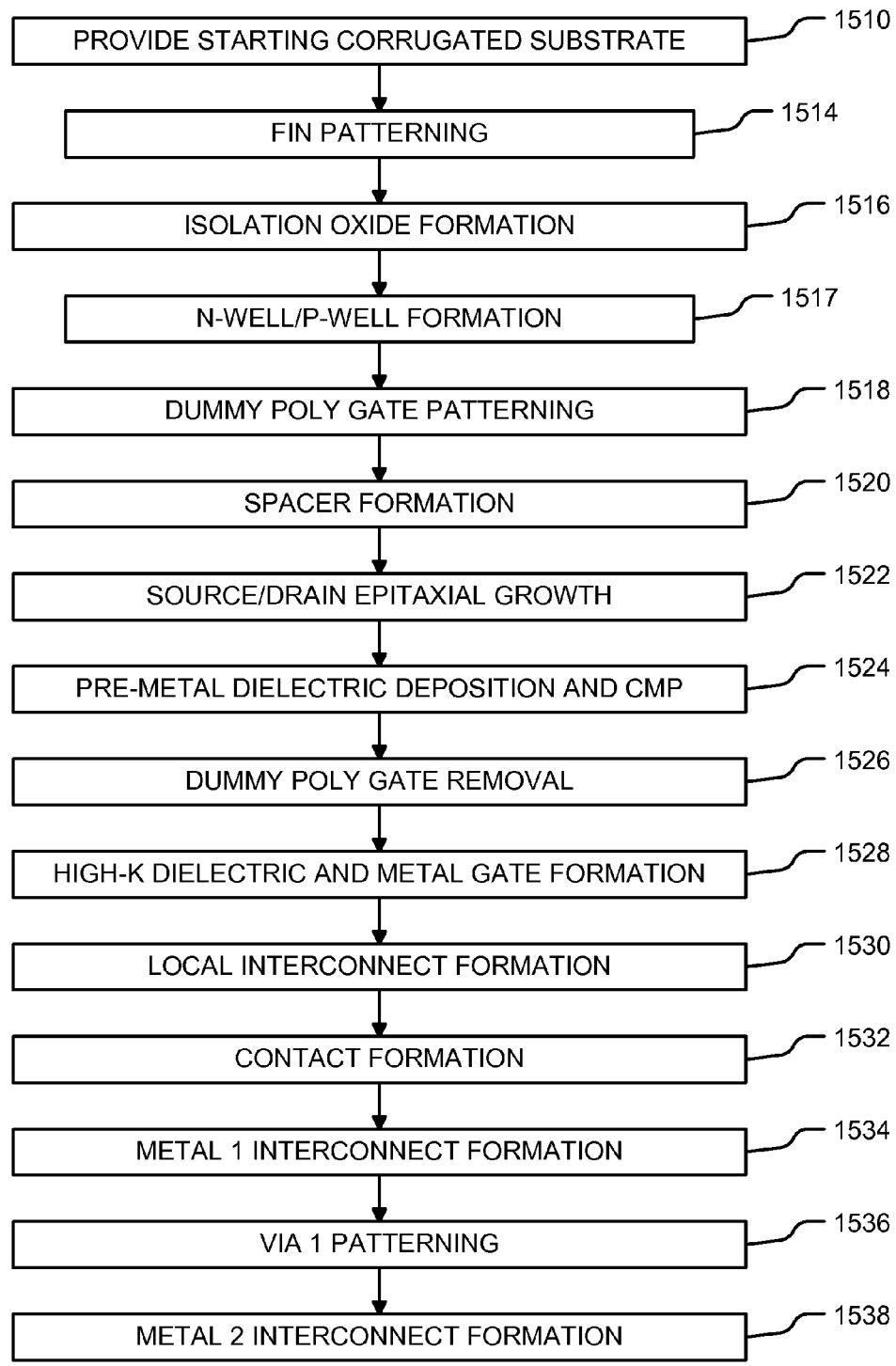
FIG. 15 is a simplified flow chart describing an integrated circuit fabrication process that can implement features of the invention.

Referring to FIG. 15, preferably the process begins in step 1510 with a so-called "corrugated" substrate, in which pre-existing ridges of semiconductor material have been formed on the substrate. A variety of corrugated substrate structures are described in King U.S. Pat. No. 7,190,050, incorporated herein by reference, any of which can be used to implement aspects of the present invention.

In step 1514, the fins are patterned using masks prepared in step 1330, so as to remove material longitudinally between fin segments which are to be electrically isolated from each other. For example, in FIG. 3, fin material is removed between fin segments 322 and 336, and between fin segments 328 and 330.

In step 1516, isolation oxide is formed on the device. The isolation oxide acts as a dielectric between the fins, both longitudinally and transversely. In step 1517, N- and P-wells are formed using masks prepared in step 1330. In step 1518, the gate electrodes of the SRAM cell array are formed and patterned using the masks prepared in step 1330. The gate electrodes are formed in this step using a sacrificial polysilicon material, which will be removed later and replaced with a high-K dielectric and metal gate.

In step 1520, spacers are formed on the sides of the dummy gate electrodes, and in step 1522, the source and drain regions of the transistors in the cell array are grown epitaxially. As used herein, the source and drain terminals of a transistor are sometimes referred to collectively as "current path terminals". A pre-metal dielectric is deposited in step 1524 and polished using CMP.

In step 1526, the dummy poly gate material is removed, and in step 1528 it is replaced with a high-K dielectric and metal gate. Local interconnects such as 342 and 344 in FIG. 3 are then formed in step 1530 using masks prepared in step 1330. Contacts are then formed in step 1532, metal 1 interconnects are formed in step 1534, vias are patterned in step 1536, and metal 2 interconnects are formed in step 1538, all using masks prepared in step 1330. Many further steps are typically performed thereafter, which will be apparent to the reader.

Since the features on the integrated circuit chip made using the fabrication process of FIG. 15 are formed using masks crated using the layout principles described elsewhere herein, it will be appreciated that aspects of the invention are reflected in the fabrication process.

Layout Geometry Files

The layout of a circuit design such as an SRAM is typically formed in step 1322 (Physical Implementation). The layout is represented in a geometry file or database on a computer readable medium which defines, among other things, all the shapes to be formed on each mask that will be used to expose the wafer during fabrication. A "computer readable medium", as the term is used herein, may include more than one physical item, such as more than one disk, or RAM segments or both, which need not all be present at a single location. As used herein, the term does not include mere time varying signals in which the information is encoded in the way the signal varies over time. The geometry file can have any of several standard formats, such as GDSII, OASIS, CREF, and so on, or it can have a non-standard format. The file describes the layout of the circuit design in the form of a mask definition for each of the masks to be generated. Each mask definition defines a plurality of polygons. For example, each of the gate electrodes may be described in the layout as an elongated rectangle having a size and position relative to other shapes (on the same or different masks, or layout layers) such that upon lithographic printing with the mask onto the wafer, the electrode shape illustrated in the drawings herein will be formed. Thus aspects of the invention are present in the geometry file. They are also present in the mask set prepared in step 1330, since the masks also carry the geometries which describe the shapes for the layout.

Macrocell Implementations

A circuit or layout that includes an SRAM as described herein can be designed in advance and provided to designers as a macrocell (which as used herein can be a standard cell). It is common for integrated circuit designers to take advantage of macrocells that have been pre-designed for particular kinds of circuits, such as logic gates, larger logic functions, memory (including SRAM) and even entire processors or systems. These macrocells are provided in a library available from various sources, such as foundries, ASIC companies, semiconductor companies, third party IP providers, and even EDA companies, and used by designers when designing larger circuits. Each macrocell typically includes such information as a graphical symbol for schematic drawings; text for a hardware description language such as Verilog; a netlist describing the devices in the included circuit, the interconnections among them, and the input and output nodes; a layout (physical representation) of the circuit in one or more geometry description languages such as GDSII; an abstract of the included geometries for use by place-and-route systems; a design rule check deck; simulation models for use by logic simulators and circuit simulators; and so on. Some libraries may include less information for each macrocell, and others may include more. In some libraries the entries are provided in separate files, whereas in others they are combined into a single file, or one file containing the entries for multiple different macrocells. In all cases the files are either stored and distributed on a computer readable medium, or delivered electronically and stored by the user on a computer readable medium. Macrocell libraries often contain multiple versions of the same logic function differing in area, speed and/or power consumption, in order to allow designers or automated tools the option to trade off among these characteristics. A macrocell library can also be thought of as a database of macrocells. As used herein, the term "database" does not necessarily imply any unity of structure. For example, two or more separate databases, when considered together, still constitute a "database" as that term is used herein. As such, the entries defining each single macrocell can also be thought of as a "database". It can be seen that aspects of the invention also may be present in macrocells and macrocell libraries.

Computer System

Figure 14:
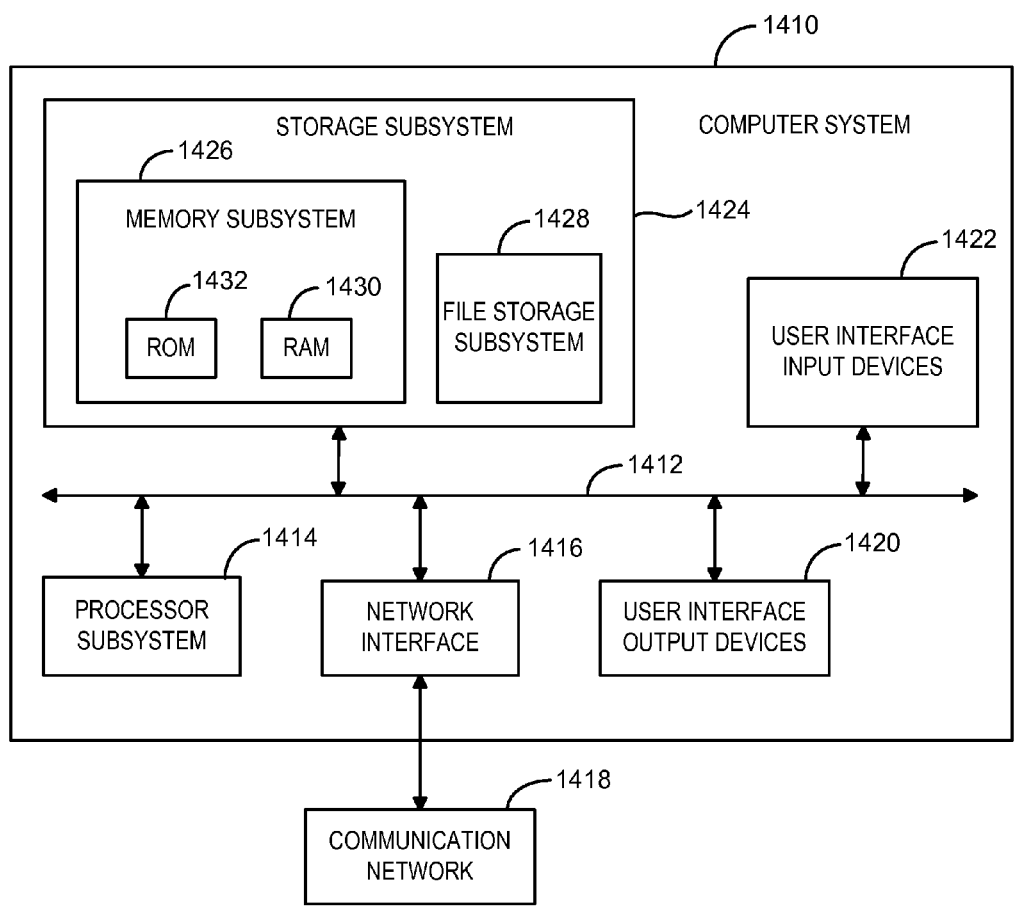
FIG. 14 is a simplified block diagram of a computer system 1410 that can be used to perform many of the computer-based steps described herein.

FIG. 14 is a simplified block diagram of a computer system 1410 that can be used to perform many of the steps of FIG. 13, including reading and interpreting layout geometry files, macrocells and macrocell libraries.

Computer system 1410 typically includes a processor subsystem 1414 which communicates with a number of peripheral devices via bus subsystem 1412. These peripheral devices may include a storage subsystem 1424, comprising a memory subsystem 1426 and a file storage subsystem 1428, user interface input devices 1422, user interface output devices 1420, and a network interface subsystem 1416. The input and output devices allow user interaction with computer system 1410. Network interface subsystem 1416 provides an interface to outside networks, including an interface to communication network 1418, and is coupled via communication network 1418 to corresponding interface devices in other computer systems. Communication network 1418 may comprise many interconnected computer systems and communication links. These communication links may be wireline links, optical links, wireless links, or any other mechanisms for communication of information, but typically it is an IP-based communication network. While in one embodiment, communication network 1418 is the Internet, in other embodiments, communication network 1418 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1422 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1410 or onto computer network 1418.

User interface output devices 1420 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 1410 to the user or to another machine or computer system.

Storage subsystem 1424 stores the basic programming and data constructs that provide the functionality of certain embodiments of the present invention. For example, the various modules implementing the functionality of certain embodiments of the invention may be stored in storage subsystem 1424. These software modules are generally executed by processor subsystem 1414.

Memory subsystem 1426 typically includes a number of memories including a main random access memory (RAM) 1430 for storage of instructions and data during program execution and a read only memory (ROM) 1432 in which fixed instructions are stored. File storage subsystem 1428 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 1428. The host memory 1426 contains, among other things, computer instructions which, when executed by the processor subsystem 1414, cause the computer system to operate or perform functions as described herein. As used herein, processes and software that are said to run in or on "the host" or "the computer", execute on the processor subsystem 1414 in response to computer instructions and data in the host memory subsystem 1426 including any other local or remote storage for such instructions and data.

Bus subsystem 1412 provides a mechanism for letting the various components and subsystems of computer system 1410 communicate with each other as intended. Although bus subsystem 1412 is shown schematically as a single bus, alternative embodiments of the bus subsystem may use multiple busses.

Computer system 1410 itself can be of varying types including a personal computer, a portable computer, a workstation, a computer terminal, a network computer, a television, a mainframe, a server farm, or any other data processing system or user device. Due to the ever-changing nature of computers and networks, the description of computer system 1410 depicted in FIG. 14 is intended only as a specific example for purposes of illustrating the preferred embodiments of the present invention. Many other configurations of computer system 1410 are possible having more or less components than the computer system depicted in FIG. 14.

As used herein, the "identification" of an item of information does not necessarily require the direct specification of that item of information. Information can be "identified" by referring to the actual information through one or more layers of indirection, or by identifying one or more items of different information which are together sufficient to determine the actual item of information. In addition, the term "indicate" is used herein to mean the same as "identify".

Also as used herein, a given value is "responsive" to a predecessor value if the predecessor value influenced the given value. If there is an intervening processing step, the given value can still be "responsive" to the predecessor value. If the intervening processing step combines more than one value, the output of the processing step is considered "responsive" to each of the value inputs. If the given value is the same as the predecessor value, this is merely a degenerate case in which the given value is still considered to be "responsive" to the predecessor value. "Dependency" of a given value upon another value is defined similarly.

The applicants hereby disclose in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicants indicate that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, whereas the memory devices have been described herein mostly using FinFET embodiments as examples, it will be understood that many of the inventive aspects apply also to other kinds of embodiments such as those using planar transistors. In addition, it will be understood that the term "FinFET", as used herein, includes 3D transistors.

In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A static random access memory comprising an array of memory cells, each particular one of the cells comprising:
   first and second pass-gate transistors each connected in the cell to perform a pass gate function;
   first and second P-channel pull-up transistors each connected in the cell to perform a pull-up function; and
   first and second N-channel pull-down transistors, each connected in the cell to perform a pull-down function, each of the transistors having a respective gate electrode and respective first and second current path terminal,
   wherein the gate electrode of a particular one of the transistors of first one of the functions does not share a layout track with the gate electrodes of any of the transistors of either of the other two functions.

2. The memory of claim 1, wherein the first function is the pull-up function.

3. The memory of claim 2, wherein the particular transistor is a first one of the pull-up transistors in the particular cell,
   wherein the gate electrode of a first one of the pull-down transistors in the particular cell shares a first layout track with a first one of the pass-gate transistors in the particular cell,
   wherein the gate electrode of a second one of the pull-down transistors in the particular cell shares a second layout track with a second one of the pass-gate transistors in the particular cell,
   wherein the gate electrode of the first pull-up transistor in the particular cell occupies a third layout track,
   wherein the gate electrode of a second pull-up transistor in the particular cell occupies a fourth layout track,
   and wherein the first, second, third and fourth layout tracks are different.

4. The memory of claim 1, wherein the first function is the pull-down function.

5. The memory of claim 4, wherein the particular transistor is a first one of the pull-down transistors in the particular cell,
   wherein the gate electrode of a first one of the pull-up transistors in the particular cell shares a first layout track with a first one of the pass-gate transistors in the particular cell,
   wherein the gate electrode of a second one of the pull-up transistors in the particular cell shares a second layout track with a second one of the pass-gate transistors in the particular cell,
   wherein the gate electrode of the first pull-down transistor in the particular cell occupies a third layout track,
   wherein the gate electrode of a second pull-down transistor in the particular cell occupies a fourth layout track,
   and wherein the first, second, third and fourth layout tracks are different.

6. The memory of claim 1, wherein the first function is the pass-gate function.

7. The memory of claim 6, wherein the gate electrodes of the two transistors of the pass-gate function in the particular cell do not share any layout tracks with the gate electrodes of any of the transistors of either of the other two functions in the particular cell.

8. The memory of claim 6, wherein the gate electrodes of the two transistors of the pass-gate function in the particular cell do not share any layout tracks with each other.

9. The memory of claim 1, wherein the first function is the pass-gate function,
   wherein the gate electrode of a first one of the pull-down transistors in the particular cell shares a first layout track with a first one of the pull-up transistors in the particular cell,
   wherein the gate electrode of a second one of the pull-down transistors in the particular cell shares a second layout track with a second one of the pull-up transistors in the particular cell,
   and wherein the gate electrode of the particular transistor in the particular cell occupies a third layout track,
   wherein the first, second and third layout tracks are different.

10. The memory of claim 9, wherein the gate electrodes in each given one of the layout tracks are of constant respective widths across the array,
    and wherein the gate electrode of the transistors in the third layout track have a width different from the gate electrodes of the transistors in at least one of the first and second tracks.

11. The memory of claim 9, wherein all the gate electrodes in each given one of the layout tracks are of constant respective widths across the array,
    and wherein the gate electrode of the transistors in the third layout track have a width different from the gate electrodes of the transistors in each of the first and second tracks.

12. The memory of claim 9, wherein the gate electrode of the other pass-gate transistor in the particular cell occupies a fourth layout track different from the first, second and third layout tracks.

13. The memory of claim 1, wherein each of the transistors is a FinFET.

14. The memory of claim 13, wherein the first function is the pass-gate function,
    wherein the first pull-down transistor in the particular cell, the second pull-up transistor in the particular cell, and the particular pass-gate transistor in the particular cell, all share a first diffusion track,
    and wherein the first pull-up transistor in the particular cell, the second pull-down transistor in the particular cell, and the second pass-gate transistor in the particular cell, all share a second diffusion track.

15. The memory of claim 14, wherein the first and second diffusion tracks are oriented parallel to each other.

16. The memory of claim 1, wherein the gate electrodes of at least three of the transistors in the particular cell occupy mutually different layout tracks.

17. The memory of claim 1, wherein the gate electrodes of four of the transistors in the particular cell occupy mutually different layout tracks, and the gate electrodes of the remaining two transistors in the particular cell each share a layout track with another transistor in the particular cell.

18. The memory of claim 1, wherein the gate electrodes of all six the transistors in the particular cell array occupy mutually different layout tracks.

19. A method for fabricating an integrated circuit device, the device to include an SRAM array which includes a plurality of SRAM cells, comprising:
  providing a substrate having formed thereon a plurality of parallel ridges of semiconductor material, separated longitudinally such that each cell contains a plurality of ridge segments, the plurality of ridge segments collectively occupying at least two of the parallel ridges;
  forming gate electrodes in parallel tracks orthogonal to the ridges, each of the gate electrodes overlying at least one of the ridge segments in each cell;
  forming N-type diffusions for a first subset of the ridge segments and P-type diffusions for a second subset of the ridge segments, regions of the device in which a gate electrode overlies a ridge segment defining channel regions of respective transistors; and
  forming interconnects which interconnect the transistors such as to define in each cell
    first and second pass-gate transistors each connected in the cell to perform a pass gate function,
    first and second P-channel pull-up transistors each connected in the cell to perform a pull-up function, and
    first and second N-channel pull-down transistors, each connected in the cell to perform a pull-down function, each of the transistors having a respective gate electrode and respective first and second current path terminal;
  wherein the gate electrode of a particular one of the transistors of first one of the functions does not share a layout track with the gate electrodes of any of the transistors of either of the other two functions.

20. The method of claim 19, wherein the first function is the pull-up function.

21. The method of claim 20, wherein the particular transistor is a first one of the pull-up transistors in the particular cell,
  wherein the gate electrode of a first one of the pull-down transistors in the particular cell shares a first layout track with a first one of the pass-gate transistors in the particular cell,
  wherein the gate electrode of a second one of the pull-down transistors in the particular cell shares a second layout track with a second one of the pass-gate transistors in the particular cell,
  wherein the gate electrode of the first pull-up transistor in the particular cell occupies a third layout track,
  wherein the gate electrode of a second pull-up transistor in the particular cell occupies a fourth layout track,
  and wherein the first, second, third and fourth layout tracks are different.

22. The method of claim 19, wherein the first function is the pull-down function.

23. The method of claim 22, wherein the particular transistor is a first one of the pull-down transistors in the particular cell,
  wherein the gate electrode of a first one of the pull-up transistors in the particular cell shares a first layout track with a first one of the pass-gate transistors in the particular cell,
  wherein the gate electrode of a second one of the pull-up transistors in the particular cell shares a second layout track with a second one of the pass-gate transistors in the particular cell,
  wherein the gate electrode of the first pull-down transistor in the particular cell occupies a third layout track,
  wherein the gate electrode of a second pull-down transistor in the particular cell occupies a fourth layout track,
  and wherein the first, second, third and fourth layout tracks are different.

24. The method of claim 19, wherein the first function is the pass-gate function.

25. The method of claim 24, wherein the gate electrodes of the two transistors of the pass-gate function in the particular cell do not share any layout tracks with the gate electrodes of any of the transistors of either of the other two functions in the particular cell.

26. The method of claim 24, wherein the gate electrodes of the two transistors of the pass-gate function in the particular cell do not share any layout tracks with each other.

27. The method of claim 19, wherein the first function is the pass-gate function,
  wherein the gate electrode of a first one of the pull-down transistors in the particular cell shares a first layout track with a first one of the pull-up transistors in the particular cell,
  wherein the gate electrode of a second one of the pull-down transistors in the particular cell shares a second layout track with a second one of the pull-up transistors in the particular cell,
  and wherein the gate electrode of the particular transistor in the particular cell occupies a third layout track,
  wherein the first, second and third layout tracks are different.

28. The method of claim 27, wherein the gate electrodes in each given one of the layout tracks are of constant respective widths across the array,
  and wherein the gate electrode of the transistors in the third layout track have a width different from the gate electrodes of the transistors in at least one of the first and second tracks.

29. The method of claim 27, wherein all the gate electrodes in each given one of the layout tracks are of constant respective widths across the array,
  and wherein the gate electrode of the transistors in the third layout track have a width different from the gate electrodes of the transistors in each of the first and second tracks.

30. The method of claim 27, wherein the gate electrode of the other pass-gate transistor in the particular cell occupies a fourth layout track different from the first, second and third layout tracks.

31. The method of claim 19, wherein each of the transistors is a FinFET.

32. The method of claim 31, wherein the first function is the pass-gate function,
  wherein the first pull-down transistor in the particular cell, the second pull-up transistor in the particular cell, and the particular pass-gate transistor in the particular cell, all share a first diffusion track,
  and wherein the first pull-up transistor in the particular cell, the second pull-down transistor in the particular cell, and the second pass-gate transistor in the particular cell, all share a second diffusion track.

33. The method of claim 32, wherein the first and second diffusion tracks are oriented parallel to each other.

34. The method of claim 19, wherein the gate electrodes of at least three of the transistors in the particular cell occupy mutually different layout tracks.

35. The method of claim 19, wherein the gate electrodes of four of the transistors in the particular cell occupy mutually different layout tracks, and the gate electrodes of the remaining two transistors in the particular cell each share a layout track with another transistor in the particular cell.

36. The method of claim 19, wherein the gate electrodes of all six the transistors in the particular cell array occupy mutually different layout tracks.

* * * * *